United States Patent [19]
Fraas et al.

[11] Patent Number: 5,505,789
[45] Date of Patent: *Apr. 9, 1996

[54] LINE-FOCUS PHOTOVOLTAIC MODULE USING SOLID OPTICAL SECONDARIES FOR IMPROVED RADIATION RESISTANCE

[75] Inventors: Lewis M. Fraas, Issaquah, Wash.; Mark J. O'Neill, Dallas, Tex.

[73] Assignee: Entech, Inc., Dallas, Tex.

[*] Notice: The term of this patent shall not extend beyond the expiration date of Pat. No. 5,344,497.

[21] Appl. No.: 300,031

[22] Filed: Sep. 2, 1994

Related U.S. Application Data

[63] Continuation-in-part of Ser. No. 47,476, Apr. 19, 1993, Pat. No. 5,344,497.
[51] Int. Cl.⁶ .......................... H01L 31/052; G02B 3/08
[52] U.S. Cl. .......................... 136/246; 359/722; 359/742; 359/743
[58] Field of Search .......................... 136/246; 359/722, 359/742–743

[56] References Cited

U.S. PATENT DOCUMENTS

| | | | |
|---|---|---|---|
| 4,069,812 | 1/1978 | O'Neill | 136/246 |
| 5,091,018 | 2/1992 | Fraas et al. | 136/246 |
| 5,096,505 | 3/1992 | Fraas et al. | 136/246 |
| 5,118,361 | 6/1992 | Fraas et al. | 136/246 |
| 5,123,968 | 6/1992 | Fraas et al. | 136/246 |
| 5,255,666 | 10/1993 | Curchod | 126/569 |
| 5,344,497 | 9/1994 | Fraas et al. | 136/246 |

OTHER PUBLICATIONS

O'Neil et al., "Development of a Fresnel Lens Gallium Arsenide . . . ", Phase 1 Final Report, NASA SBIR Contract No. NAS3–24871, Entech, Inc. (1986).

Piszczor et al., "The Mini–Dome Fresnel Lens Photovoltaic Concentrator Array . . . ", 21st IEEE Photovoltaic Specialist Conference, pp. 1271–1276 (1990).

Fraas et al., "Over 30% Efficient Tandem Gallium Solar Cells . . . ", Optoelectronics—Devices and Technologies, vol. 5, No. 2, pp. 297–310, Dec. 1990.

Fraas et al., "Advances Photovoltaic Power Systems . . . ", Proceedings for the Third Annual Symposium of the University of Arizona/NASA Space Engineering Research Center . . . , pp. 11–9–11–21 (Feb. 20–22, 1992).

Todorof, "A 450 Suns Concentrator Module Design", Conference Record, 20th IEEE Photovoltaic Specialists Conf., Las Vegas, NV, Sep. 1988, pp. 1347–1352.

Kuryla et al., "22.7% Efficient 1000X GaAs Concentrator Module", Conference Record, 21st IEEE Photovoltaic Specialists Conf., Kissimmee, Florida, May 1990, pp. 1142–1146.

*Primary Examiner*—Aaron Weisstuch
*Attorney, Agent, or Firm*—James Creighton Wray

[57] ABSTRACT

A novel low-cost solar photovoltaic module using line-focus lenses and photovoltaic receivers incorporating high-performance photovoltaic cells is described. It consists of an array of linear arched Fresnel lenses with a linear photovoltaic cell receiver located along the focal line of each lens. The lens consists of a protective superstrate with molded silicone Fresnel grooves on its inner surface. The photovoltaic cell receiver consists of high efficiency cells interconnected in a string with a solid secondary optical element adhesive bonded to the cells. The entrance aperture of each secondary optical element is rectangular in shape and the optical secondaries are butted up against each other in a line to form a continuous entrance aperture along the focal line. In addition to providing more concentrated sunlight, the solid optical secondaries shield the cells against radiation damage.

5 Claims, 3 Drawing Sheets

LINE-FOCUS PHOTOVOLTAIC MODULE USING SOLID OPTICAL SECONDARIES FOR IMPROVED RADIATION RESISTANCE

This application is a continuation-in-part of application Ser. No. 08/047,476 filed Apr. 19, 1993, now U.S. Pat. No. 5,344,497.

BACKGROUND OF THE INVENTION

The present invention relates generally to solar electric power modules for space satellite applications. More specifically, the low cost product of this invention will provide physically smaller power supplies per kilowatt with less drag for low earth orbit, more radiation resistant power supplies for high radiation orbits, and lighter power supplies per kilowatt for communication satellites in geosynchronous orbits.

Prior art solar electric power supplies for use on space satellites today use flat plate photovoltaic modules in which large area silicon or gallium arsenide (GaAs) solar cells are assembled like tiles side-by-side to form large area single crystal arrays. These power supplies are made lighter by making the single crystal cells thinner and thinner with the consequence that they become more and more fragile and expensive. The area related power density for these power supplies is limited by the cell energy conversion efficiencies which are generally less than 20%. Since GaAs flat plate solar cells are more efficient and more radiation resistant than silicon flat plate cells, GaAs electric power supplies are preferred to silicon for many applications. However, GaAs cells are heavier and much more expensive.

In order to overcome many of the limitations in today's satellite solar electric power supplies, O'Neill (NASA SBIR —1986) proposed a power module consisting of an array of mini-domed Fresnel lenses which concentrate sunlight onto small area standard thickness GaAs concentrator cells. Each mini-domed lens concentrates the sunlight to a point-focus at which point a small GaAs cell is located. The lenses are made very thin and lightweight and since the GaAs cells are very small, they are very durable, lightweight, and less expensive. Given the concentrated sunlight concept, Fraas and Avery (1990) then proposed a tandem concentrator solar cell consisting of a GaAs light sensitive cell stacked on top of an infrared sensitive GaSb solar cell. The demonstrated energy conversion efficiency of the resultant cell-stack is 30%. These two concepts have now been combined (Piszczor et. al.—1990, Fraas et. al.—1992) to produce a point-focus concentrator module incorporating high efficiency tandem-cells. The resultant power supply (when compared with a silicon flat plate power supply producing the same amount of electric power) is one-third the size and half the weight of the silicon power supply.

While the performance of the above point-focus mini-domed lens module is quite impressive, there are still several disadvantages inherent in this design. First, the point-focus lens in its present form is not durable in the space environment. Second, the present mini-dome lens is very expensive to manufacture. Finally, third, the point-focus module must be pointed at the sun with two-axis tracking. In the following paragraphs, these problems are described in more detail.

The optical design of the point-focus mini-domed Fresnel lens requires the Fresnel prisms on the inner surface of the lens to be re-entrant such that they are interlocking with the molding tool. As a result of this fact, the lens is molded from transparent silicone rubber. After the rubber lens is cured, it is removed from the mold by stretching the lens. However in space, the silicone rubber is attacked by ultraviolet (UV) rays, and in low earth orbit, by atomic oxygen. Hence, the rubber lens must be protected in space. Two solutions to this degradation problem have been proposed. The first solution involves adhesive bonding the rubber lens inside a domed glass superstrate and the second solution involves coating the lens with a protective multilayer coating. The forming, trimming, and lamination of the glass superstrate to the silicone lens has proved to be a critical manufacturing problem. Costs are high and reproducibility is poor. Coated lenses have been fabricated but the coating crazes in handling and thermal cycling leading to poor optical transmission. These point-focus lens problems suggest that the point-focus module will not be durable and will be very expensive to manufacture. The line-focus module described herein bypasses these problems.

While the point-focus lens array with tandem cell-stacks offers the highest efficiency of any present space solar array technology, there are many missions which are not best served by the mini-dome lens array approach. For example, some missions can provide only single-axis sun-tracking for the solar array. The mini-dome point-focus lens array requires two-axis sun-tracking, and will not work for such missions. However, line-focus concentrators will work with single-axis sun-tracking.

Therefore, it is highly desirable to produce a line-focus electric power supply incorporating high performance tandem cell-stacks so that it can serve a larger number of missions including those where only single-axis sun-tracking is available. Furthermore, it is necessary to produce low cost lenses which are easy to manufacture and durable in space against UV and atomic oxygen. Finally, for radiation orbits, it is also desirable to protect the cells against radiation damage. The line-focus photovoltaic module incorporating tandem cell-stacks described herein has these beneficial characteristics.

SUMMARY OF THE INVENTION

We have devised a novel line-focus tandem-cell electric power supply integrating a new durable, low-cost line-focus, arched Fresnel lens and a unique line-focus, radiation-resistant tandem-cell receiver. Like the domed lens, the novel arched line-focus Fresnel lens consists of a silicone rubber grooved inner surface and a glass superstrate. However unlike the domed lens, the arched glass superstrate can be bent flat and the silicone grooves molded directly to the flat glass without interlocking prisms in the mold. Therefore, this line focus lens is inexpensive to make in a space-survivable form.

Given this line-focus lens, the problems to be solved for the tandem-cell receiver are, first, to provide for the additional leads associated with a tandem cell-stack, and second, to provide for a higher concentration ratio in order to make the cells low-cost and affordable. These two problems are solved by using a solid optical secondary with a rectangular entrance aperture bonded to the top cell in the tandem cell-stack. All of the light arriving at the line focus receiver is then collected when the optical secondary rectangular entrance aperture on one cell-stack is butted up against the adjacent optical secondaries in a receiver cell string. This scheme has three advantages. First, it leaves area at the base where two optical secondaries join for tandem cell leads. Second, the use of an optical secondary in this scheme also increases the concentration ratio, thereby making the cells more affordable, and third, the optical secondary covers the cell-stack, providing for radiation shielding of the cells.

The objectives of this invention are to produce a high performance module which is low-cost, durable, and usable in a large number of space missions. The resultant line-focus tandem-cell module has a performance comparable to the mini-domed lens module since it operates at the same concentration ratio and incorporates the same tandem-cells. It is durable because the arched lens is now manufacturable with a protective glass superstrate. It is also durable because the cells are protected against radiation damage by an optical secondary element. It is low cost because the lens can be more easily manufactured and because the same small cell sizes are used. Finally, our new line-focus tandem-cell module is usable on a larger number of missions because it can be used with single-axis sun-tracking.

A novel low-cost solar photovoltaic module using line-focus lenses and photovoltaic receivers incorporating high-performance photovoltaic cells is described. It consists of an array of linear arched Fresnel lenses with a linear photovoltaic cell receiver located along the focal line of each lens. The lens consists of a protective superstrate with molded silicone Fresnel grooves on its inner surface. The photovoltaic cell receiver consists of high efficiency cells interconnected in a string with a solid secondary optical element adhesive bonded to the cells. The entrance aperture of each secondary optical element is rectangular in shape and the optical secondaries are butted up against each other in a line to form a continuous entrance aperture along the focal line. In addition to providing more concentrated sunlight, the solid optical secondaries shield the cells against radiation damage.

These and further and other objects and features of the invention are apparent in the disclosure, which includes the above and ongoing written specification, with the claims and the drawings.

BRIEF DESCRIPTION OF THE DRAWINGS

Drawings of preferred embodiments of the invention are annexed hereto so that the invention may be better and more fully understood, in which.

DETAILED DESCRIPTION OF THE PREFERRED EMBODIMENTS

Figure 1:
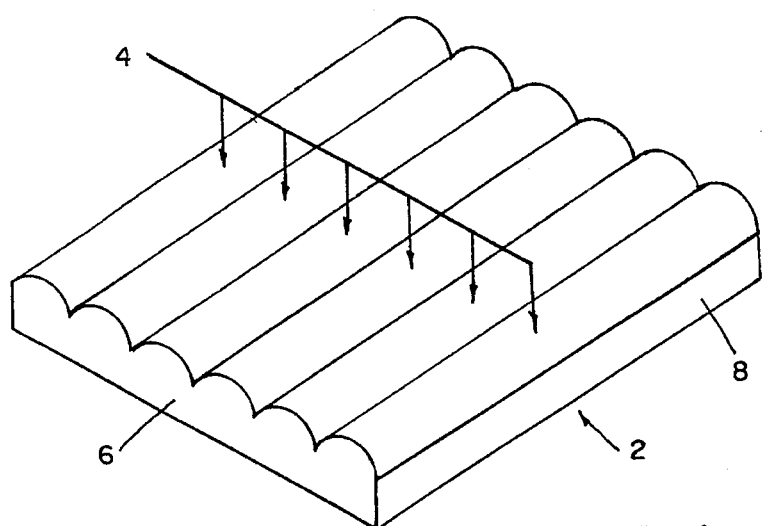
FIG. 1 is a drawing of our electric power module containing an array of several arched line-focus Fresnel lenses.
Figure 2:
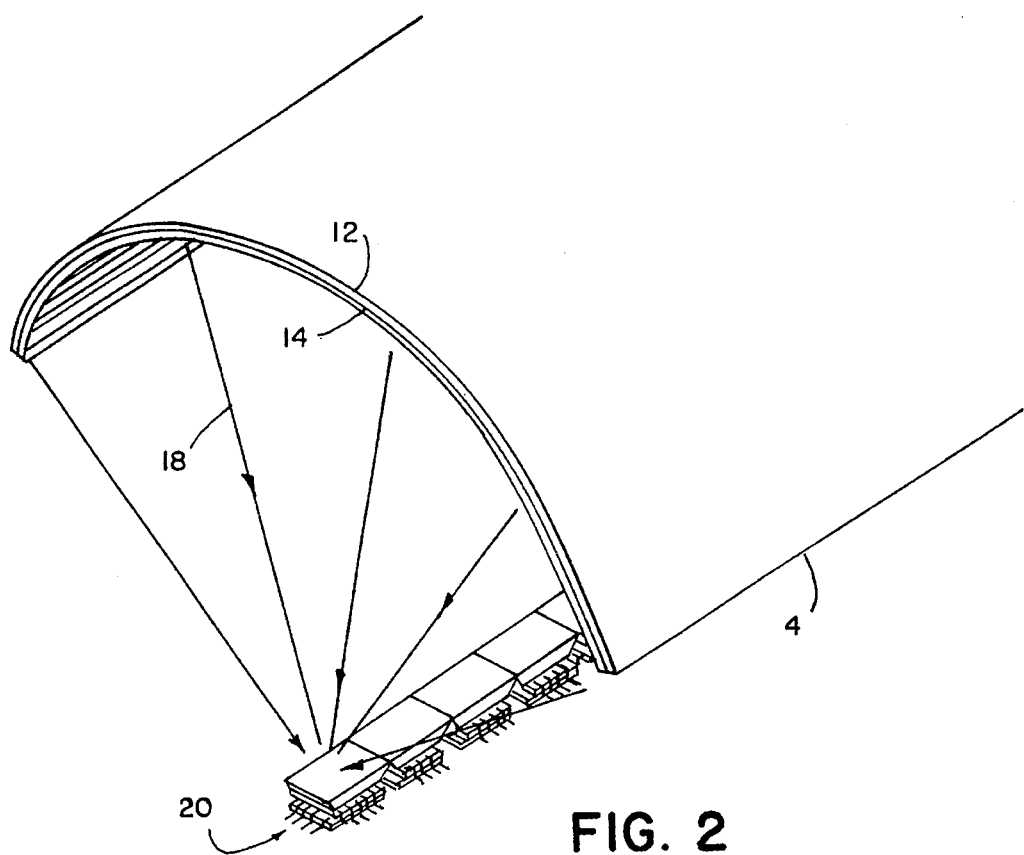
FIG. 2 is a cross-sectional view showing a single arched Fresnel lens with light rays focused to a tandem-cell receiver string located along the lens focal line.

Referring to FIGS. 1 and 2, the solar electric power module 2 contains several linear Fresnel lenses 4 where each lens (4 in FIG. 2) concentrates sunlight to a line-focus receiver 20 which converts the solar energy into electric power. Besides the lens array, each module 2 contains bulkheads 6 and sheet metal sides 8 and a sheet metal back plane (not shown).

Each linear Fresnel lens (4 in FIG. 2) consists of a thin glass superstrate 12 with a silicone rubber lens 14 molded onto its inner surface. This arched Fresnel lens is designed to focus the sun's rays 18 to a line where a tandem-cell receiver 20 captures all rays and converts them into useful electric power.

While this combination of materials, namely glass and silicone rubber, is presently the preferred choice, it should be evident that the lens could be made from other materials and still fall within the spirit of this invention. For example, the lens could be made entirely of DuPont Tefzel (registered trademark) and coated with a multi-layer coating such as several which can be provided by Optical Coating Laboratory, Inc. (OCLI) to protect the Tefzel from the space environment. Such coatings can provide protection from both monatomic oxygen and ultraviolet radiation in orbit. Alternatively, the lens could be made of a Tefzel/silicone laminated construction, with protective coatings on the outermost surface. Or the lens could be made entirely of silicone, with appropriate protective coatings on the outermost surface.

While our module's preferred embodiment uses arched Fresnel lenses, it should be evident that other means for focusing the sun's rays to a line exist. Two examples are a flat Fresnel lens or a line focus mirror. All means of focusing sunlight into our line-focus tandem cell receiver 20 are to be included within the spirit of this invention.

Figure 3:
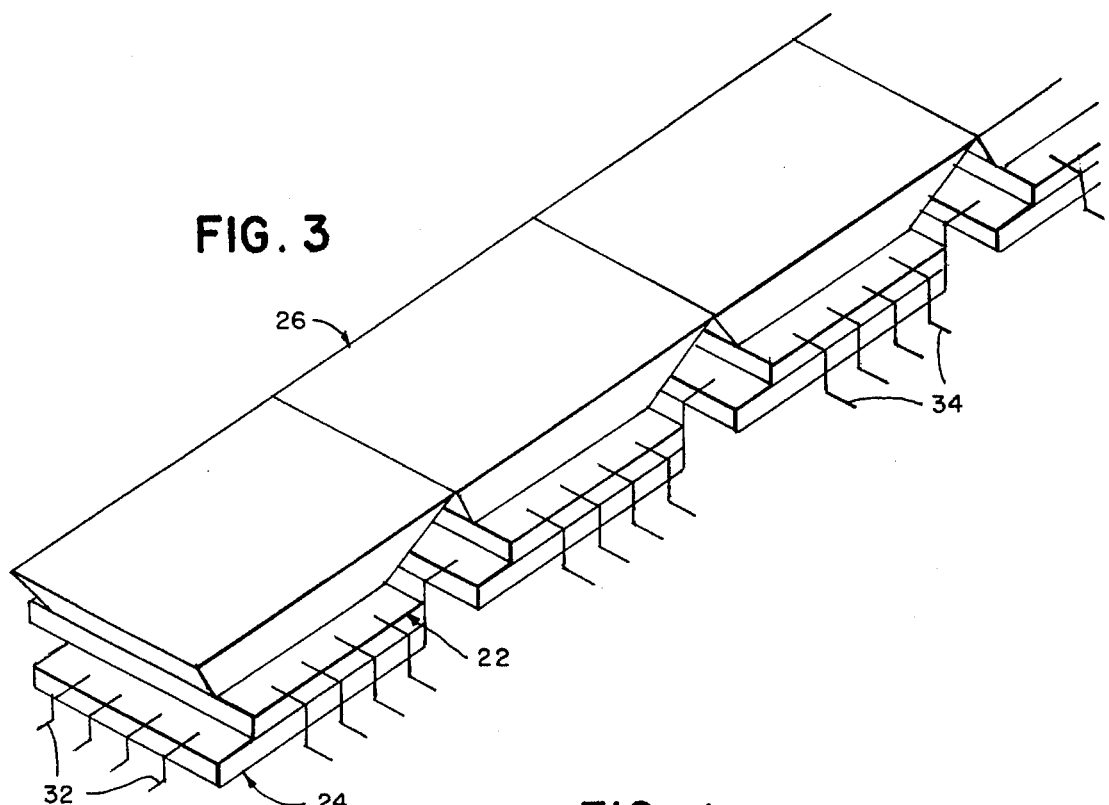
FIG. 3 is an enlarged view of the tandem-cell receiver showing the two cells in each stack, cell leads, and optical secondaries with their entry apertures forming a continuous line-focus receiver.
Figure 4A:
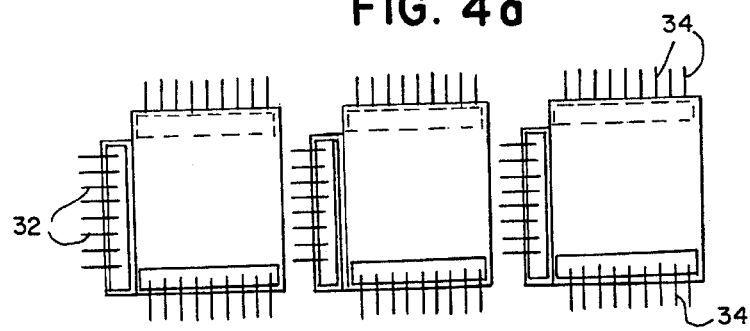
FIGS. 4a–4c show (a) a top view of three cell-stacks in a row with associated leads, (b) the two-terminal voltage-matched circuit associated with the three stacks, and (c) a side view of the three cell-stacks also showing optical secondaries. In (c), a light ray is shown deflected away from the leads between cell-stacks into a cell-stack.
Figure 4B:
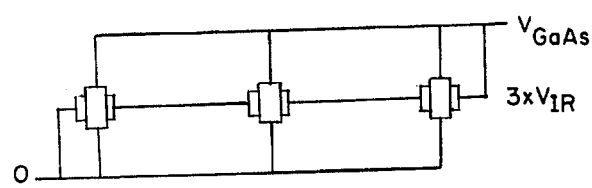
Figure 4C:
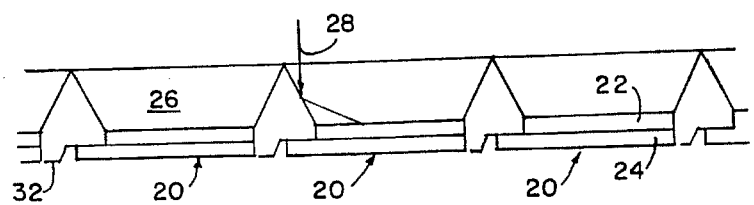

FIGS. 3 and 4 show a preferred embodiment of our line-focus tandem cell receiver. Referring to FIG. 3, our tandem-cell receiver contains tandem-cells 22/24 with their associated leads 34/32 and secondary optical elements 26. The secondary optical elements shown in FIG. 3 are made from glass and are shaped like inverted truncated pyramids. The truncated surface of secondary optical element 26 is adhesive bonded directly to the top cell 22 and the larger face serves as the entry aperture for the sun's rays. The entry aperture of each optical secondary is rectangular and each entry aperture is butted up against two adjacent optical secondary entry apertures with a minimal gap to provide a continuous linear receiver aperture. Referring to FIG. 4c, the optical secondaries 26 serve to capture all of the light rays 28 arriving at the focal-line and deflect them into active cell area.

Although the optical secondaries are shown in FIGS. 3 and 4 as inverted truncated pyramids, other shapes are also possible. For example, the side walls can be parabolic rather than flat as long as they efficiently funnel light rays down to the cell active area. As a further example, the top surface of the entry aperture can be convex rather than flat. The important constraint is that the entry apertures have a rectangular cross section so that they can be butted against one another in a line with negligible gaps.

FIG. 4 shows our preferred line-focus tandem-cell receiver 20 in more detail. FIG. 4a shows a top view of three cell-stacks in a line. Note that each cell-stack consists of two rectangular chips rotated 90 degrees with respect to one another. The top chip (22 in FIG. 4c) is sensitive to the visible portion of the sun's energy but transmits the infrared (IR) portion on to the bottom chip (24 in FIG. 4c) which converts the IR energy. In the case that the top cell is a GaAs cell and the bottom cell is a GaSb cell, the top cell energy conversion efficiency is 24% while the bottom cell conversion efficiency is 6% so that the cell-stack converts 30% of the sun's energy into electricity.

Figure 5:
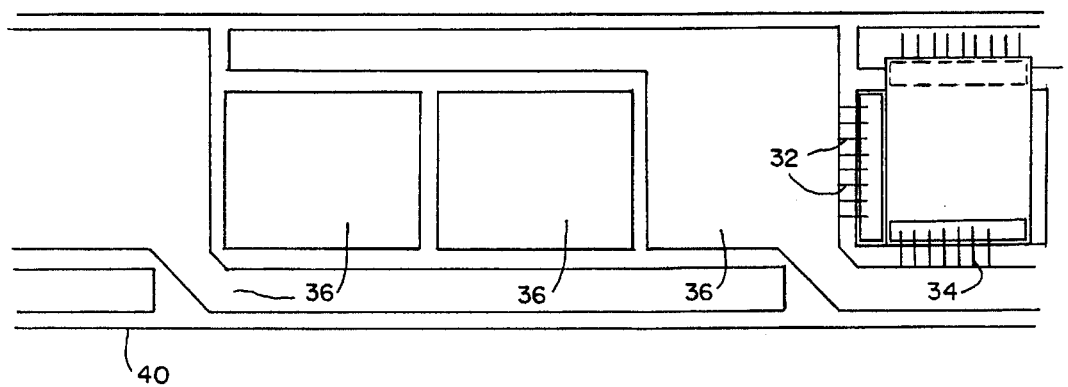
FIG. 5 shows the ceramic circuit carrier and heat spreader to which the cell-stacks are electrically bonded. This circuit carrier electrically interconnects the cell-stacks into two-terminal voltage-matched groups which are connected into a series string.

A tandem cell-stack is a four terminal device. Referring to FIGS. 4a & c, the top cell requires two sets of leads 34 connected to its top and bottom surfaces while one set of leads 32 is connected to the top surface of the bottom cell 24. The bottom surface of the bottom cell is connected directly to a circuit metallization (FIG. 5). FIG. 4b shows how a four terminal cell-stack is converted into a two terminal cell circuit. The specific case shown is for the GaAs/GaSb tandem cell-stack where the GaSb cell generates one third the voltage of a GaAs cell. In this case, three GaSb cells are wired in series while three GaAs cells are wired in parallel to produce a voltage-matched triplet. This voltage-matched circuit concept has been described previously (Fraas and Avery—1990). The relevance to the line-focus receiver is simply to note how the leads fall into a geometrically natural and efficient layout. The leads 32 series connecting the bottom cells fall into the spaces in-between the bottom cells and the parallel leads 34 for the top cells run along the sides of the string. The optical secondaries allow room for the series connecting leads 32 without an accompanying light loss. Note the short distances between cell-stacks with the associated short current paths particularly for the series connected bottom cells. These short distances will dramatically reduce series resistance losses relative to the point-focus prior art design. In a preferred embodiment, means for radiative cooling of the solar cell is provided.

While FIG. 4 shows the GaAs/GaSb triplet as a preferred embodiment, other tandem cell-stacks are possible with the same 3:1 voltage ratio or other voltage ratios, e.g. 2:1.

FIG. 5 shows a ceramic circuit carrier 40 to which the lead sets 32 and 34 and the bottom of cell 24 are bonded in order to create a high voltage cell string. The patterned metallization 36 shown is for a 3:1 voltage ratio. Other circuit carrier materials and voltage ratios are possible.

While we have specifically described a photovoltaic receiver incorporating high efficiency stacked tandem cells, it is clear that any type of high efficiency photovoltaic cell can be combined with solid optical secondaries in a line focus receiver for use in a line focus concentrator module. Such a receiver has the advantage of providing more sunlight concentration and excellent radiation shielding of the high efficiency cell.

Figure 6:
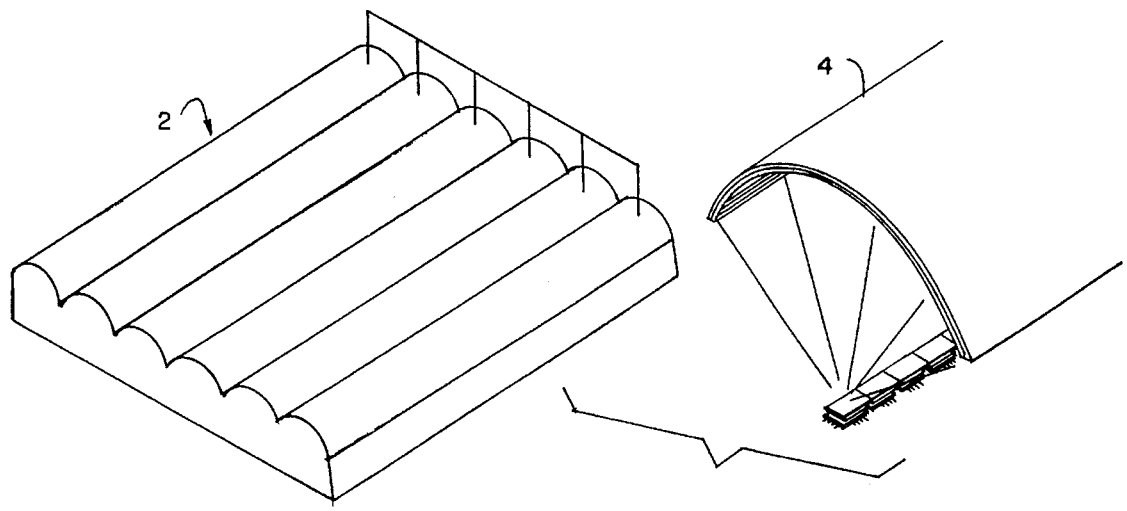
FIG. 6 shows a composite of FIGS. 1 through 5.

Finally, FIG. 6 shows the space array and the photovoltaic receiver assembly.

While the invention has been described with reference to specific embodiments, modifications and variations of the invention may be constructed without departing from the scope of the invention, which is defined in the following claims.

We claim:

1. A line-focus photovoltaic module incorporating an array of arched linear Fresnel lenses producing a focal line of concentrated solar energy on center below each lens, said solar energy being captured by a continuous line of secondary optical elements, said secondary optical elements having rectangular entrance apertures butted up against each other in a continuous line and said secondary optical elements funneling substantially all captured solar energy down to high efficiency photovoltaic cells, where each of said linear arched Fresnel lenses is comprised of one or more transparent materials.

2. The line-focus photovoltaic module of claim 1, wherein each linear arched Fresnel lens is formed with grooves on its inner surface by first bending an arched glass superstrate flat and applying a primer coating to an inner surface of the arched glass superstrate;

then applying a silicone coating to a mold with parallel grooves and pressing the flat glass superstrate flush on top of the silicone coating, and forming silicone coated grooves on the inner surface;

then curing the silicone coating and lifting the glass superstrate with attached silicone coated grooves away from the mold; finally, allowing the glass superstrate to relax back to its original arched form, the parallel grooves having been originally formed in the mold tool for producing Fresnel grooves in the arched lens and for producing a line focus by the arched lens.

3. The line-focus photovoltaic module of claim 1, wherein each linear arched Fresnel lens is formed with grooves on its inner surface by first molding a groove pattern into a flat transparent polymer material;

then bonding a transparent protective superstrate to the non-grooved surface of the flat transparent polymer material;

then applying protective coatings to the outer surface of the protective superstrate;

finally, bending the resultant lens to its final shape and attaching it to a space power system solar array.

4. A linear arched Fresnel lens comprising a protective superstrate on the outer surface of the lens with grooves molded in a polymer material layer formed on the inner surface of the lens, said protective superstrate being doped or coated for blocking ultraviolet rays and/or atomic oxygen found in space from damaging the polymer inner surface of the lens.

5. A space power system employing the combination of at least one arched Fresnel lens primary optical concentrator, at least one secondary optical element, at least one high efficiency solar cell, and means for radiative cooling of said solar cell in the space environment.

* * * * *